(12) United States Patent
Zhou et al.

(10) Patent No.: US 7,779,895 B2
(45) Date of Patent: Aug. 24, 2010

(54) PROTECTIVE DEVICE FOR PROTECTING THERMAL INTERFACE MATERIAL AND FASTENERS OF HEAT DISSIPATION DEVICE

(75) Inventors: Shi-Wen Zhou, Shenzhen (CN); Jun Cao, Shenzhen (CN); Qing-Song Xu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 234 days.

(21) Appl. No.: 12/102,016

(22) Filed: Apr. 14, 2008

(65) Prior Publication Data

US 2009/0255648 A1    Oct. 15, 2009

(51) Int. Cl.
*F28F 7/00* (2006.01)
(52) U.S. Cl. .......... 165/80.3; 165/104.33; 165/73; 165/76; 165/79; 361/697; 361/710; 361/704; 257/722; 174/16.3
(58) Field of Classification Search ........ 165/185, 165/80.3, 72, 73, 76, 79, 104.26, 104.33; 361/697, 701–704, 709–711, 700; 257/715; 174/15.2
See application file for complete search history.

(56) References Cited

U.S. PATENT DOCUMENTS

| | | | | |
|---|---|---|---|---|
| 2,838,722 A * | 6/1958 | Watson | ........................ | 257/711 |
| 4,546,411 A * | 10/1985 | Kaufman | ..................... | 361/705 |
| 5,897,917 A * | 4/1999 | Hinshaw et al. | ............. | 422/258 |
| 6,029,740 A * | 2/2000 | Lee et al. | ........................ | 165/76 |
| 6,049,458 A * | 4/2000 | Lee et al. | ..................... | 361/705 |
| 6,059,116 A * | 5/2000 | Hinshaw et al. | ............. | 206/714 |
| 6,644,395 B1 * | 11/2003 | Bergin | ........................ | 165/185 |
| 6,915,844 B2 * | 7/2005 | Chou | ..................... | 165/104.33 |
| 6,935,420 B1 * | 8/2005 | Dong et al. | ................. | 165/185 |
| 6,938,682 B2 * | 9/2005 | Chen et al. | ............. | 165/104.33 |
| 6,952,348 B2 * | 10/2005 | Wu | ............................. | 361/719 |
| 7,068,514 B2 * | 6/2006 | Chang et al. | ................ | 361/705 |
| 7,319,592 B2 * | 1/2008 | Wang et al. | ................. | 361/705 |
| 7,365,983 B2 * | 4/2008 | Huang et al. | ................ | 361/704 |
| 7,554,807 B2 * | 6/2009 | Wu et al. | ..................... | 361/705 |
| 2002/0163076 A1 * | 11/2002 | Tzeng et al. | ................ | 257/720 |
| 2003/0112603 A1 * | 6/2003 | Roesner et al. | ............ | 361/719 |

* cited by examiner

*Primary Examiner*—Terrell L McKinnon
(74) *Attorney, Agent, or Firm*—Frank R. Niranjan

(57) ABSTRACT

A heat dissipation device assembly includes a heat dissipation device for dissipating heat from an electronic element and a protective device assembly. The heat dissipation device includes a base with fasteners extending therethrough, a plurality of fins arranged on a top of the base, and a heat conducting plate attached on a bottom of the base. A thermal interface material is spread on a bottom surface of the heat conducting plate. The protective device assembly includes a first cover attached to a bottom of the heat conducting plate and a second cover separated from the first cover and attached to a lateral side of the base. The first cover protects the thermal interface material from being contaminated and the second cover protects the fasteners from dropping from the base, when the heat dissipation device is transported.

15 Claims, 5 Drawing Sheets

PROTECTIVE DEVICE FOR PROTECTING THERMAL INTERFACE MATERIAL AND FASTENERS OF HEAT DISSIPATION DEVICE

BACKGROUND OF THE INVENTION

1. Field of the Invention

The present invention relates generally to a protective device assembly, and particularly to a cover assembly for a heat dissipation device to protect thermal interface material spread on the heat dissipation device from contamination, and to protect fasteners of the heat dissipation device from dropping out thereof, before the heat dissipation device is assembled to a CPU or CPU module.

2. Description of Related Art

Electronic devices such as central processing units (CPUs) generate a lot of heat during normal operation. If the heat generated by the electronic devices is not properly dissipated, it can deteriorate their operational stability and damage associated electronic devices. Thus the heat must be quickly and efficiently removed to ensure the normal operation of these electronic devices. A heat dissipation device is often attached onto a top surface of a CPU to remove heat therefrom. The heat dissipation device is secured to a board by fasteners, wherein the CPU is mounted on the board. Gaps inevitably exist between the heat dissipation device and the CPU and hence causes reduction of heat transferring efficiency from the CPU to the heat dissipation device due to poor heat-transmission through air in the gaps. To ensure intimate contact between the CPU and the heat dissipation device, a layer of thermal interface material is usually spread on a heat absorption surface of a heat sink to improve heat-transmission between the heat sink and the CPU. The heat generated by the CPU causes the thermal interface material to become more liquid, enabling the thermal interface material to fill in the air gap formed between the heat sink and the CPU, thereby improving heat-transmission efficiency between the heat sink and the CPU.

However, the thermal interface material cannot be applied to the heat sink in advance since it is not solid at room temperature and may contaminate surrounding articles or be contaminated by dust or foreign particles before the heat sink is attached to the CPU. To overcome the above problem, various protective devices have been developed. The protective devices are attached onto a bottom surface of a heat sink to enclose the thermal interface material spread on the bottom of the heat sink. The thermal interface material thus cannot be contaminated by dust or foreign particles, and does not contaminate surrounding articles when the heat sink is transported or handled. By using the protective device, the thermal interface material can be applied to the heat sink in advance, thereby simplifying the process of attachment of the heat sink to the CPU. However, the protective device covers the whole bottom of the heat sink, thereby being prone to be loosened from the bottom portion of the heat sink during transport. Furthermore, the protective device needs to enclose parts of the heat sink which do not have a layer of thermal interface material, thus wasting the material for forming the protective device.

Moreover, the protective device just covers on the bottom of the heat sink. The fasteners for securing the heat sink to the printed circuit board extend through a lateral side of the heat sink, which are not covered by the protective device; the fasteners are easily to drop from the heat sink when the heat dissipation device is transported.

What is needed, therefore, is an improved protective device assembly which can overcome the above problems.

SUMMARY OF THE INVENTION

A heat dissipation device assembly includes a heat dissipation device for dissipating heat from an electronic element and a protective device assembly. The heat dissipation device includes a base with fasteners extending therethrough, a plurality of fins arranged on a top of the base, and a heat conducting plate attached on a bottom of the base. A thermal interface material is spread on a central portion of a bottom surface of the heat conducting plate. The protective device assembly includes a first cover attached to a bottom of the heat conducting plate and a second cover separated from the first cover and attached to a lateral side of the base. The first cover protects the thermal interface material from being contaminated and the second cover protects the fasteners from dropping from the base, when the heat dissipation device is transported or handled.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
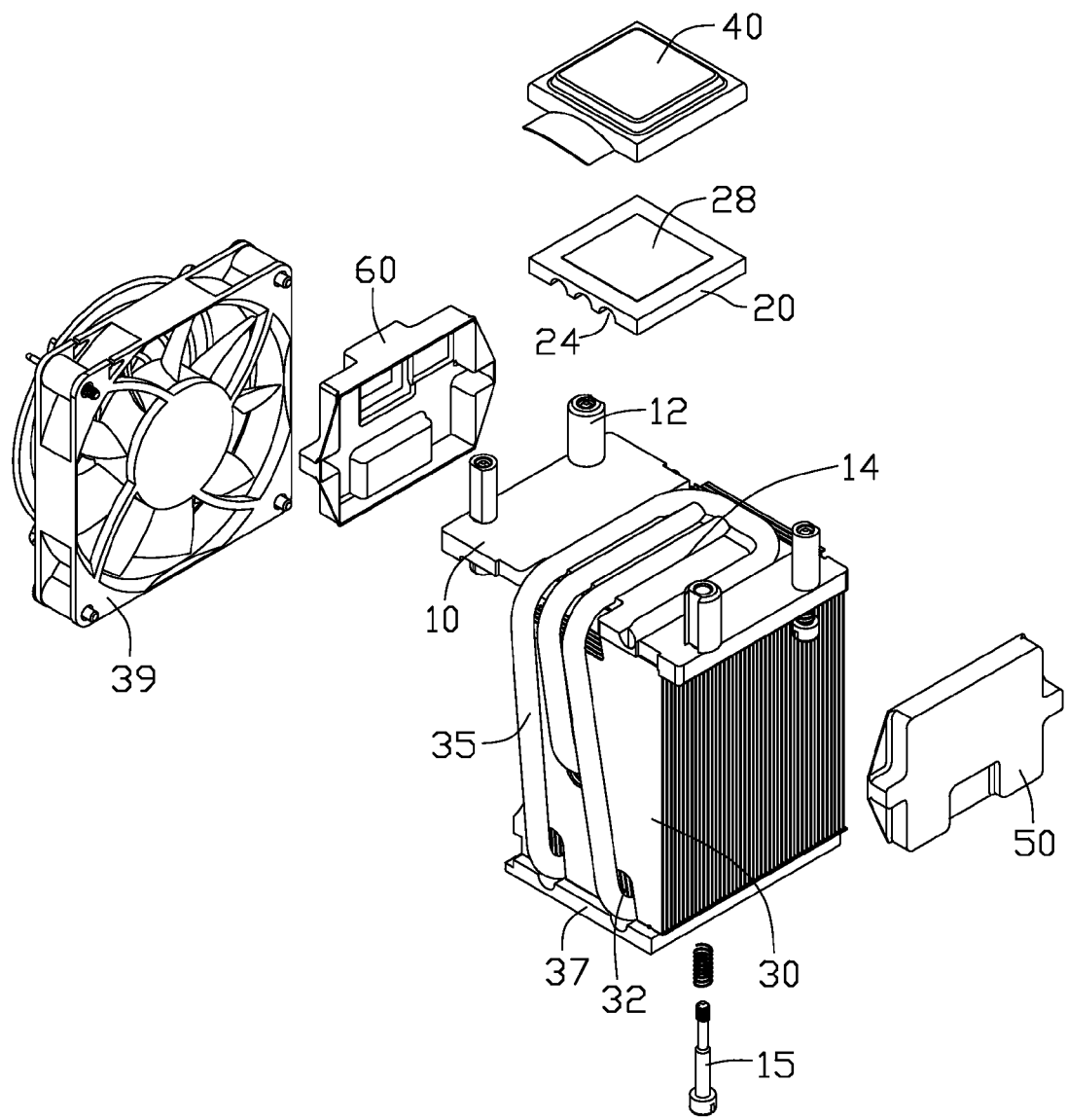
FIG. 1 is an exploded, isometric view of a heat dissipation device assembly in accordance with a preferred embodiment of the present invention.
Figure 2:
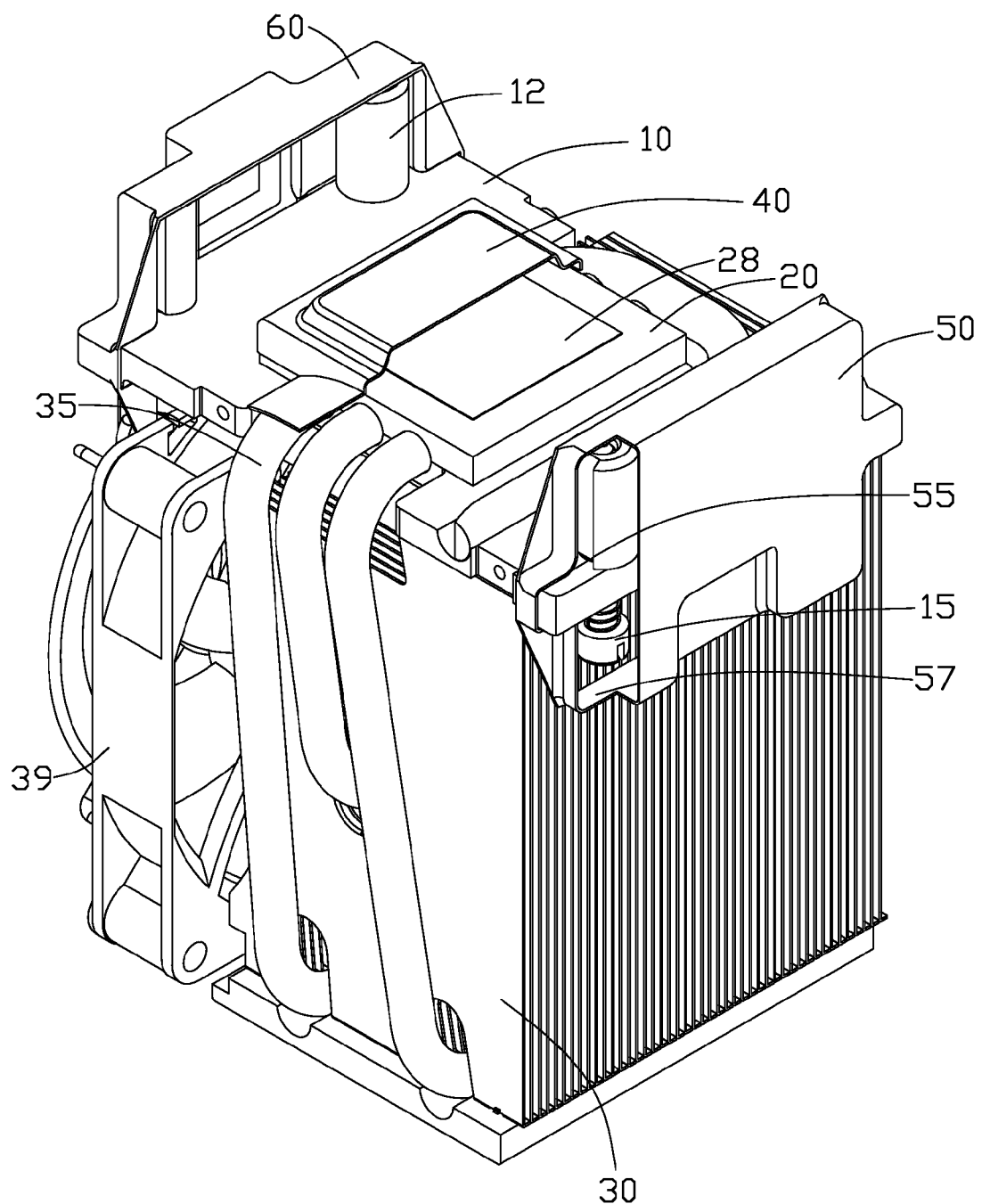
FIG. 2 is an assembled, isometric view of the heat dissipation device assembly in FIG. 1, with parts of first and second covers thereof being cut away.

Referring to FIGS. 1-2, a heat dissipation device assembly in accordance with a preferred embodiment of the present invention comprises a heat dissipation device (not labeled) for dissipating heat generated by an electronic element (not shown) and a protective device assembly (not labeled) covering the heat dissipation device.

The heat dissipation device comprises a base 10, a heat conducting plate 20 attached to a bottom of the base 10, a plurality of fins 30 arranged on a top of the base 10, and a fan 39 arranged on the top of the base 10 and located at a lateral side of the fins 30. Three heat pipes 35 thermally connect the base 10, the heat conducting plate 20 and the fins 30 together.

The base 10 is a rectangular plate with a plurality of semi-cylindrical grooves 14 defined in a bottom thereof. The grooves 14 position at a substantially center portion of the base 10 and are parallel to each other and parallel to two short sides of the base 10. Four posts 12 extend downwardly from four corners of the bottom of the base 10, respectively. Two diagonal posts 12 are different from the other two posts 12 for mistake proofing when the heat dissipation device is assembled onto the electronic element by extending the posts 12 through four holes in a printed circuit board (not shown) on which the electronic component is mounted. A hole (not labeled) is defined in each of the posts 12 and extends through the base 10. A fastener 15 extends from the top of the base 10 through the hole of each of the posts 12 to threadedly engage with a locking board (not shown) attached to a bottom of the printed circuit board, thereby securing the heat dissipation device on the printed circuit board. Each of the fasteners 15 comprises a screw (not labeled) and an annular spring (not labeled) surrounding the screw.

The heat conducting plate 20 is substantially square. A plurality of semi-cylindrical grooves 24 is defined at a top surface of the heat conducting plate 20, which cooperate with the grooves 14 of the base 10 to define channels for receiving parts of the heat pipes 35 therein. A thermal interface material 28, such as a thermal grease, is spread on a bottom of the heat conducting plate 20. The thermal interface material 28 locates on a center portion of the bottom of the heat conducting plate 20.

The fins 30 are parallel to each other to define a channel (not labeled) between every two adjacent fins 30. A plurality of holes 32 is defined in the fins 30 for parts of the heat pipes 35 inserting therein. A top plate 37 covers a top of the fins 30.

The heat pipes 35 each comprises one end (not labeled) sandwiched between the base 10 and the heat conducting plate 20, and another end (not labeled) extending upwardly from the one end thereof and inserting into the holes 32 of the fins 30. Specifically, the another ends of two of the heat pipes 35 are simultaneously attached to the top plate 37.

The fan 39 is mounted on the base 12 and located at the lateral side of the fins 30. The fan 39 generates cooling air to flow through the channels of the fins 30 to cool the fins 30 when the heat dissipation device is in operation.

The protective device assembly comprises a first cover 40 covering on the bottom of the heat conducting plate 20, and second and third covers 50, 60 covering two lateral short sides of the base 10, respectively.

Figure 3:
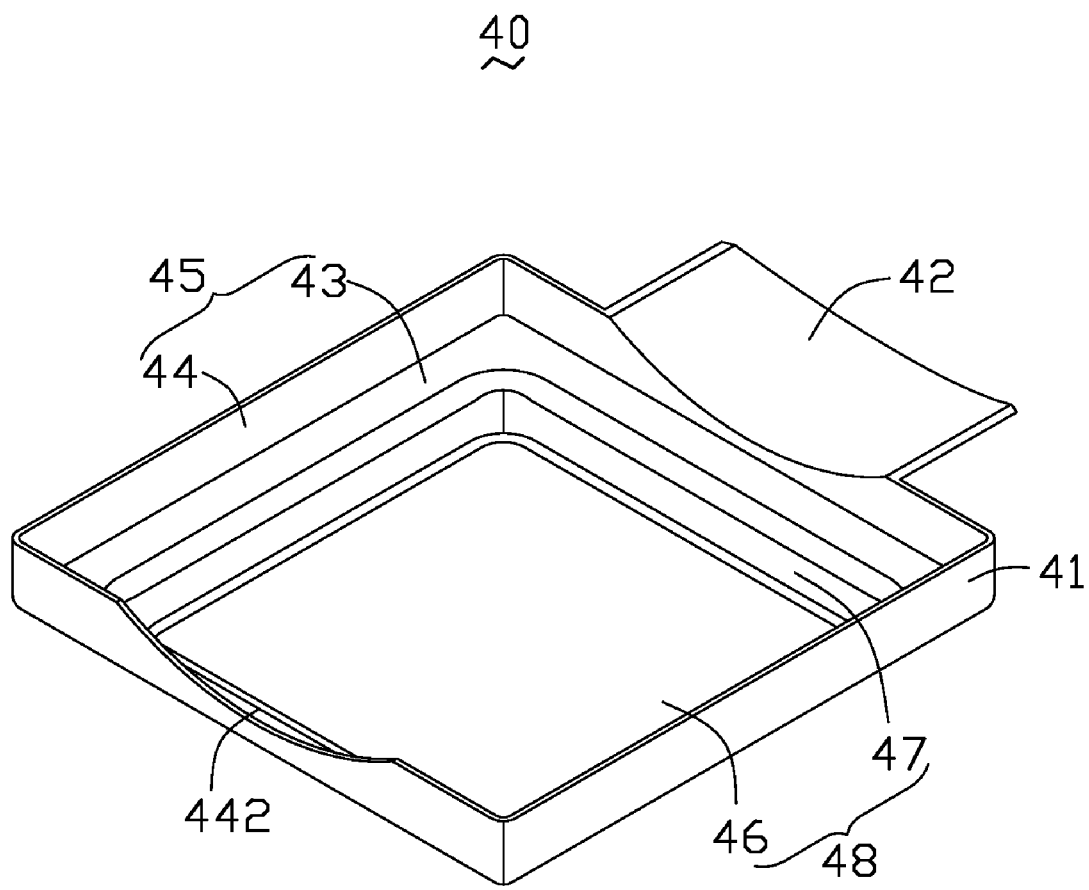
FIG. 3 is an enlarged view of the first cover of the heat dissipation device assembly in FIG. 1, but shown in a different aspect.

Please also referring to FIG. 3, the first cover 40 comprises a case 41 and a tongue 42 extending outwardly from a side of the case 41. The case 41 comprises an annular frame 45 and a cap 48 protruding downwardly from an inner edge of the frame 45. The frame 45 of the case 41 comprises four plane sides 43 and four straight flanges 44 respectively extending perpendicularly and upwardly from outside edges of the plane sides 43 of the frame 45 to engage with the heat conducting plate 20. Two arc-shaped concaves 442 are defined in a center portion of two opposite flanges 44 of the frame 45. The concaves 442 locate corresponding to the one ends of the heat pipes 35 to avoid intervening with the one ends of the heat pipes 35. The tongue 42 extends outwardly from an edge of one of the concaves 442. The tongue 42 covers parts of the one ends of the heat pipes 35 which are positioned out of the heat conducting plate 20. The cap 48 comprises a board 46 and four sloping walls 47 respectively extending upwardly and outwardly from inner edges of the plane sides 43. The sloping walls 47 interconnect the board 46 and the plane sides 43. The cap 48 locates corresponding to the thermal interface material 28 spread on the heat conducting plate 20 and covers the thermal interface material 28. The frame 45 attaches to the heat conducting plate 20 around the thermal interface material 28 and engages with four sides of the heat conducting plate 20 via the four flanges 44 thereof.

Figure 4:
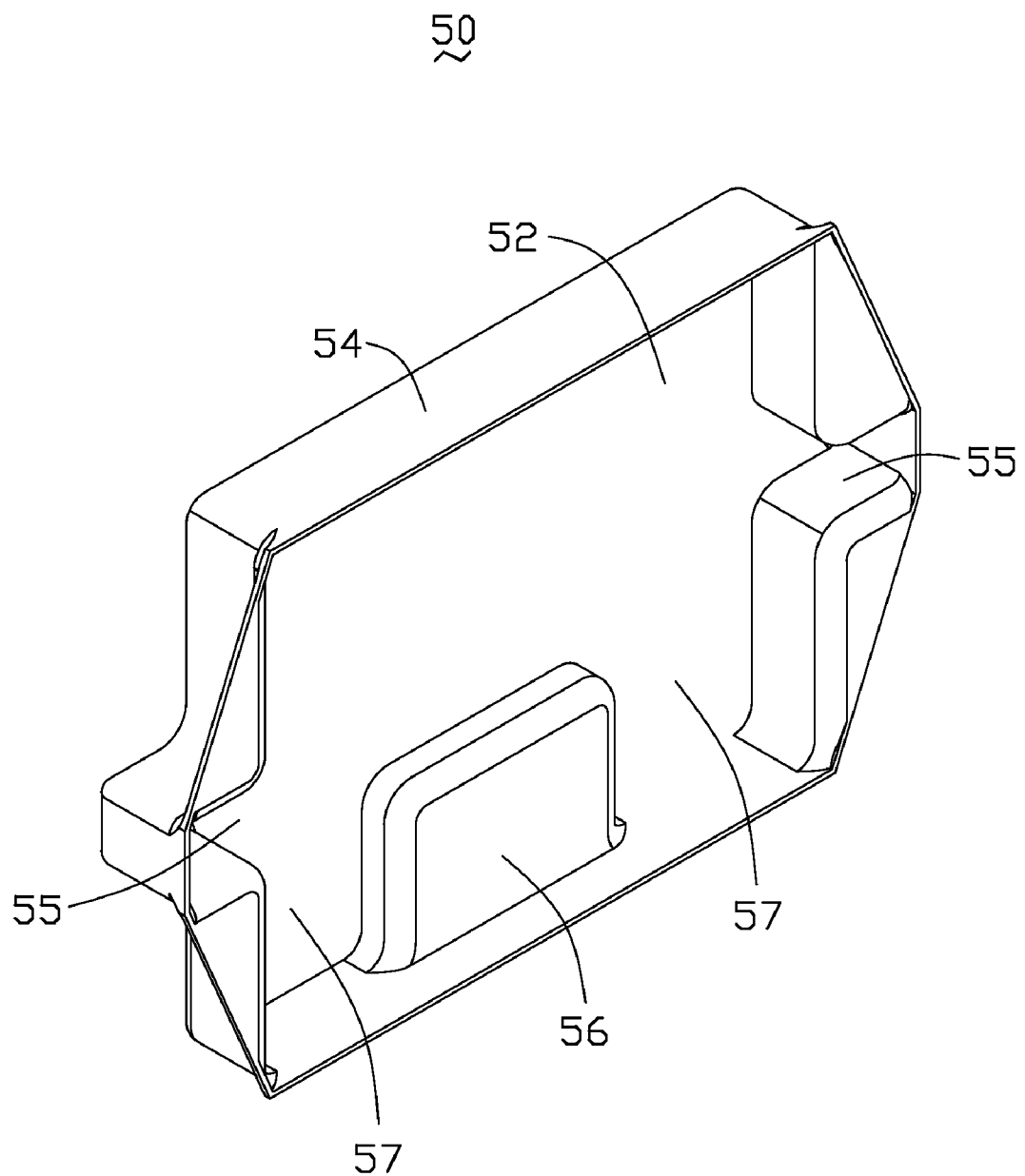
FIG. 4 is an enlarged view of the second cover of the heat dissipation device assembly in FIG. 1, but shown in a different aspect.

The second cover 50 covers one of the two short sides of the base 10 and receives two fasteners 15 therein. Please also referring to FIG. 4, the second cover 50 comprises a substantially rectangular board 52 and an annular sidewall 54 extending sideward from edges of the board 52. The sidewall 54 encloses the fasteners 15 of the base 10 therein. Two opposite short sides of the sidewall 54 each have a middle portion protruding outwardly to define a groove 55 therein. The grooves 55 are formed for engagingly receiving opposite ends of the corresponding short side of the base 10 therein. A protrusion 56 extends toward the fins 30 and located between the two short sides of the sidewall 54. A width of the protrusion 56 is smaller than that of the sidewall 54. A receiving space 57 is defined between the protrusion 56 and each of the short sides of the sidewall 54. Each of the two fasteners 15 is received in each of the spaces 57. A width of the second cover 50 is equal to a length of a part of the base 10 which extends out of the fins 30. When the second cover 50 is attached to the heat dissipation device with the base 10 received in the grooves 55 and the posts 12 received in the spaces 57, a free end edge of a lower portion of the sidewall 54 abuts against the fins 30 to define an enclosure space which can receive the fasteners 15 to protect them from dropping from the heat dissipation device. An upper, long side of the sidewall 54 engages bottom ends of the two posts 12.

Figure 5:
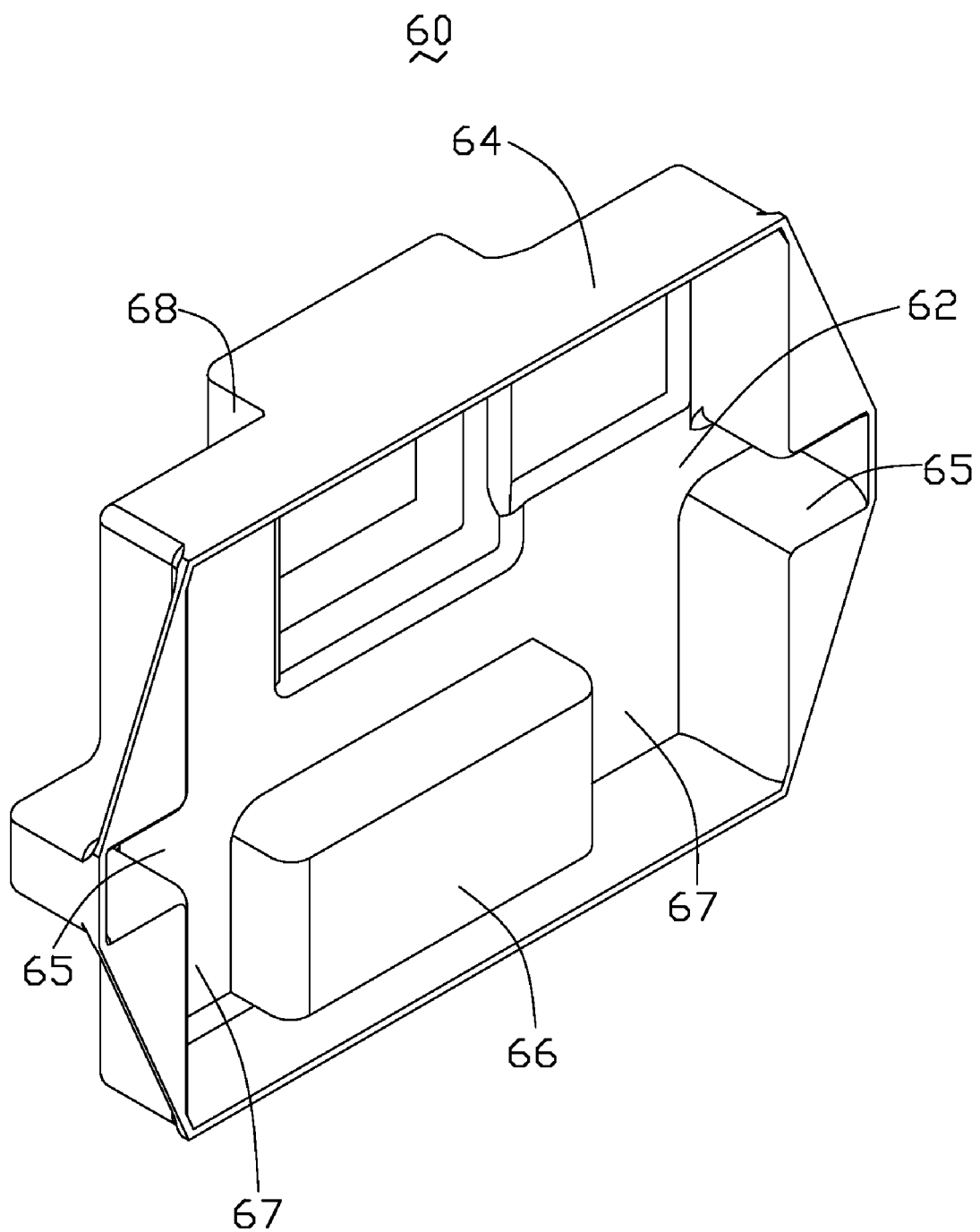
FIG. 5 is an enlarged view of a third cover of the heat dissipation device assembly in FIG. 1.

The third cover 60 covers the other short side of the base 10 which is adjacent to the fan 39 and receives the other two posts 12 with the other two fasteners 15 therein. Please also referring to FIG. 5, the third cover 60 has a similar configuration to the second cover 50. The third cover 60 comprises a substantially rectangular board 62 and an annular sidewall 64 extending sideward from edges of the board 62. The sidewall 64 encloses the other posts 12 and fasteners 15 of the base 10 therein. Each of middle portions of two opposite short sides of the sidewall 64 protrude outwardly to define a groove 65 therein. The grooves 65 are used for engagingly receiving opposite ends of the other short side of the base 10 therein. A first protrusion 66 extends sideward from the board 62 and towards the fins 30, and located between the two short sides of the sidewall 64. A receiving space 67 is defined between the first protrusion 66 and each of the short sides of the sidewall 64. Each of the two fasteners 15 is received in each of the spaces 67. The difference between the second cover 50 and the third cover 60 is that the third cover 60 further has a second protrusion 68 extending sideward from the board 62 along a direction opposite to that of the first protrusion 66 and away from the fins 30. The second protrusion 68 is also located between the two short sides of the sidewall 64. An outer face of the second protrusion 68 is coplanar with an outer surface of the fan 39 for conveniently transporting the heat dissipation device assembly. Understandably, the configuration of the second cover 50 can be equal to that of the third cover 60 in different embodiments.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device assembly, comprising:
   a heat dissipation device comprising a base with fasteners extending therethrough, a plurality of fins arranged on a top of the base, a heat conducting plate attached on a bottom of the base, and a thermal interface material spread on a bottom surface of the heat conducting plate; and
   a protective device assembly comprising a first cover attached to a bottom of the heat conducting plate and protecting the thermal interface material from being contaminated, and a second cover separated from the first cover and attached to a lateral side of the base, the second cover covering the fasteners at the lateral side of the base and protecting the fasteners from dropping from the base when the heat dissipation device assembly is inverted.

2. The heat dissipation device assembly as claimed in claim 1, wherein the first cover comprises a case, the case comprising an annular frame and a cap protruding downwardly from an inner edge of the frame, the cap being located corresponding to the thermal interface material and covering the thermal interface material, the frame being attached to the heat conducting plate around the thermal interface material.

3. The heat dissipation device assembly as claimed in claim 2, wherein the frame of the case is quadrilateral and comprises four plane sides, and the cap comprises a board and four sloping walls respectively extending from inner edges of the plane sides, the sloping walls interconnecting the plane sides and the board.

4. The heat dissipation device assembly as claimed in claim 3, wherein four straight flanges respectively extend perpendicularly and upwardly from outside edges of the plane sides of the frame to engage with the heat conducting plate.

5. The heat dissipation device assembly as claimed in claim 4, wherein two arc-shaped concaves are defined in two opposite flanges of the frame, and a tongue extends outwardly from an edge of one of the two opposite flanges defining the concaves.

6. The heat dissipation device assembly as claimed in claim 1, wherein the second cover comprises a board and an annular sidewall extending sideward from edges of the board, the annular sidewall enclosing the fasteners therein, opposite parts of the annular sidewall protruding outwardly to define grooves, the grooves engagingly receiving opposite ends of the lateral side of the base therein.

7. The heat dissipation device assembly as claimed in claim 6, wherein a plurality of posts extend downwardly from the base, the fasteners engaging in the posts, bottom ends of the posts engaging with one side of the sidewall of the second cover.

8. The heat dissipation device assembly as claimed in claim 6, wherein a protrusion extends sideward from the board and between two lateral sides of the sidewall, and a space is defined between the protrusion and each of the two lateral sides of the sidewall, the space receiving a corresponding one of the fasteners therein.

9. The heat dissipation device assembly as claimed in claim 6, further comprising a third cover attached to another lateral side of the base to protect other fasteners on the another lateral side of the base from dropping from the base, the third cover having a same configuration as that of the second cover.

10. The heat dissipation device assembly as claimed in claim 6, further comprising a third cover attached to another lateral side of the base to protect other fasteners on the another lateral side of the base from dropping from the base, the third cover comprising a board, an annular sidewall extending sideward from edges of the board, and a protrusion extending sideward from the board, the annular sidewall of the third cover enclosing the other fasteners therein, opposite parts of the annular sidewall of the third cover protruding outwardly to define grooves, the grooves engagingly receiving opposite ends of the another lateral side of the base therein.

11. The heat dissipation device assembly as claimed in claim 10, further comprising a fan arranged on the base and located at a lateral side of the fins, an outer surface of the fan being coplanar with an outer surface of the protrusion of the third cover.

12. The heat dissipation device assembly as claimed in claim 1, further comprising a heat pipe with one end thereof sandwiched between the heat conducting plate and the base, and another end thereof extending upwardly from the one end and inserting in the fins.

13. A heat dissipation device assembly comprising:
 a heat dissipation device comprising:
  a base having opposite top and bottom surfaces;
  a plurality of fins extending from the top surface of the base;
  a heat conducting plate attached to the bottom surface of the base;
  a plurality of fasteners attached to two opposite lateral sides of the base;
  a heat pipe having a first end sandwiched between the base and the heat conducting plate and a second end connecting with the fins; and
  a thermal interface material spread on a bottom surface of the heat conducting plate; and
 a protective device assembly comprising:
  a first cover attached to the heat conducting plate and covering the thermal interface material thereby protecting the thermal interface material from contamination;
  a second cover separated from the first cover, attached to one of the two opposite lateral sides of the base and covering the fasteners at the one of the two opposite lateral sides of the base thereby protecting the fasteners thereat from dropping from the base when the heat dissipation device assembly is inverted; and
  a third cover separated from the first and second covers, attached to the other one of the two opposite lateral sides of the base and covering the fasteners at the other one of the two opposite lateral sides of the base thereby protecting the fasteners thereat from dropping from the base when the heat dissipation device assembly is inverted.

14. The heat dissipation device assembly as claimed in claim 1, wherein each fastener at the lateral side of the base is entirely enclosed by the second cover.

15. The heat dissipation device assembly as claimed in claim 13, wherein each fastener at the one of the two opposite lateral sides of the base is entirely enclosed by the second cover, and each fastener at the other one of the two opposite lateral sides of the base is substantially entirely enclosed by the third cover.

\* \* \* \* \*